US00RE38222E

(19) United States
(12) Reissued Patent
Wu

(10) Patent Number: US RE38,222 E
(45) Date of Reissued Patent: Aug. 19, 2003

(54) ELECTROSTATIC DISCHARGE PROTECTION CIRCUIT TRIGGERED BY CAPACITIVE-COUPLING

(75) Inventor: Chau-Neng Wu, Kaoshiung Hsien (TW)

(73) Assignee: Winbond Electronics Corp., Hsinchu (TW)

(21) Appl. No.: 09/436,404

(22) Filed: Nov. 9, 1999

Related U.S. Patent Documents

Reissue of:
(64) Patent No.: 5,686,751
Issued: Nov. 11, 1997
Appl. No.: 08/672,542
Filed: Jun. 28, 1996

(51) Int. Cl.[7] ..... H01L 23/62
(52) U.S. Cl. ..... 257/356; 257/355; 257/360
(58) Field of Search ..... 257/355, 356, 257/360, 358, 363

(56) References Cited

U.S. PATENT DOCUMENTS

| | | | | | |
|---|---|---|---|---|---|
| 4,246,502 | A | * | 1/1981 | Kubinec | 257/356 |
| 4,261,772 | A | * | 4/1981 | Lane | 257/532 |
| 4,441,249 | A | * | 4/1984 | Alspector et al. | 257/296 |
| 5,086,365 | A | * | 2/1992 | Lien | 257/356 |
| 5,286,992 | A | * | 2/1994 | Ahrens et al. | 257/356 |
| 5,337,279 | A | * | 8/1994 | Gregory et al. | 257/295 |
| 5,449,939 | A | * | 9/1995 | Horiguchi et al. | 257/360 |
| 5,486,716 | A | * | 1/1996 | Saito et al. | 257/356 |
| 5,491,358 | A | * | 2/1996 | Miyata | 257/546 |
| 5,528,188 | A | * | 6/1996 | Au et al. | 361/56 |
| 5,892,262 | A | * | 4/1999 | Wu et al. | 257/356 |
| 5,959,488 | A | * | 9/1999 | Lin et al. | 327/313 |

FOREIGN PATENT DOCUMENTS

| | | | |
|---|---|---|---|
| JP | 0551142 | * | 1/1980 |
| JP | 5524489 | * | 2/1980 |
| JP | 8165369 | * | 9/1983 |
| JP | 0592358 | * | 1/1984 |
| JP | 0316156 | * | 1/1991 |
| JP | 0444262 | * | 2/1992 |

* cited by examiner

*Primary Examiner*—Phat X. Cao
(74) *Attorney, Agent, or Firm*—Rabin & Berdo, P.C.

(57) ABSTRACT

An electrostatic discharge (ESD) protection circuit connected to an integrated circuit pad for protecting an internal circuit from ESD damage. The ESD protection circuit includes an NMOS/PMOS transistor, a capacitor, and a load The NMOS/PMOS is configured with a drain connected to the IC pad and a source for connection to the circuit $V_{SS}/V_{DD}$. Agate of the NMOS/PMOS transistor is tied to the source. The capacitor is connected between the IC pad and the bulk of the NMOS/PMOS transistor The load, which is either another NMOS/PMOS transistor or a resistor, is to be connected between the $V_{SS}/V_{DD}$ and the bulk of the NMOS/PMOS transistor. In accordance with the invention, the NMOS/PMOS transistor is fabricated in a P-well/N-well region of a semiconductor substrate. The capacitor includes an IC pad and a polysilicon layer therebelow, with an intervening dielectric layer.

22 Claims, 7 Drawing Sheets

ELECTROSTATIC DISCHARGE PROTECTION CIRCUIT TRIGGERED BY CAPACITIVE-COUPLING

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates generally to a technique for protection against electrostatic discharge damage of integrated circuits. More particularly, the invention relates to an electrostatic discharge protection circuit triggered by capacitive-coupling.

2. Description of the Related Art

Electrostatic discharge, hereinafter "ESD," is a common phenomenon the occurs during handling of semiconductor integrated circuit ("IC") devices. An electrostatic charge may accumulate for various reasons and produce potentially destructive effects on an IC device. Damage typically cm occur during a testing phase of IC fabrication or during assembly of the IC onto a circuit board, as well as during use of equipment into which the IC has bean installed. Damage to a single IC due to poor ESD protection in an electronic device can partially or sometimes completely hamper its functionality. EDS protection for semiconductor ICs is, therefore, a reliability issue.

ESD stress models are based on the reproduction of typical discharge pulses to which the IC may be exposed during manufacture or handling. Three standard models, known as the Human Body Model (HBM), Machine Model (MM), and Charged Device Model (CDM) have been developed. The human-body model is set forth in U.S. Military Standard MIL-SID-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

Referring to FIGS. 1 and 2, circuit diagrams of ESD protection circuits conventionally used respectively with an input pad and an output pad of an IC package are schematically depicted. As shown in FIG. 1, an NMOS transistor $M_1$ is utilized protect an internal circuit 6 from the ESD stress that may appear at the input pad 5. The gate, source and bulk of the NMOS transistor $M_1$ are all tied to circuit ground $V_{SS}$. The drain of the NMOS transistor $M_1$ is connected to the input pad 5. As shown in FIG. 2, an output buffer consisting of an NMOS transistor $M_2$ and a PMOS transistor $M_3$ is employed to protect the internal circuit 6 from ESD damage at the output pad 7. Accordingly, the gates of the NMOS and PMOS transistors are both coupled to the internal circuit 6, and the drains of the transistor, are tied together and to the output pad 7. Moreover, the source and bulk of the NMOS transistor $M_2$ are tied together and to circuit ground $V_{SS}$. The source and bulk of the PMOS transistor $M_3$ are tied together and to a $V_{DD}$ power rail However, in light of the trend toward submicron scale IC fabrication, MOS transistor vulnerability to ESD stress has been greatly reduced due to advanced bases, such as using lightly-doped drain (LDD) structures and clad silicide diffusions. In addition, the conventional ESD protection circuit design layout has a multi-finger structure. Therefore, during an ESD event, minority carriers will crowd within a local area and flow along the same direction and trigger meridian, finger to turn on, consequently resulting in local beating and degradation of the performance of EST) circuits configurated with finger-type NMOS

SUMMARY OF THE INVENTION

It is therefore an object of the invention to provide an electrostatic discharge protection circuit triggered by capacitive-coupling which can be used at an input pad or an output pad to protect the internal circuit from ESD damage.

It is another object of the invention to provide an electrostatic protecting circuit triggered by capacitive-coupling, having a capacitor including a metal pad and a polysilicon layer therebelow and having an increased coupling into without consuming extra layout area.

The invention achieves the above-identified objects by providing an electrostatic discharge protection circuit for protecting an internal circuit which includes a semiconductor substrate and a P-well region formed in the substrate. At least one contact region is formed in the P-well region, as is an isolating structure. A conducting layer is formed on the isolating structure and is coupled to the contact region. A dielectric layer is formed overlying the conducting layer, and a metal pad is formed on the dielectric layer, such that the metal pad, the dielectric layer, and the conducting layer form a capacitor for coupling ESD voltage to the P-well region when an ESD voltage appears at the pad.

Further, a first N-type heavily-doped region is formed in the P-well region and is coupled to the pad. A second N-type heavily-doped region for coupling to a circuit ground of the internal circuit is formed in the P-well, spaced apart and electrically isolated from the first N-type heavily-doped region. A gate structure is formed on the P-well region, between the first N-type heavily-doped region and the second N-type heavily-doped region, for connection to the circuit ground, such that the first N-type heavily-doped region, the second N-type heavily-doped region, the gate structure, and the P-well region form an NMOS transistor which bypasses ESD stress when an ESD voltage is coupled to the P-well region through the capacitor. The NMOS transistor is coupled to the circuit ground by a load connected between the contact region and the circuit ground, when the gate structure and the second N-type heavily-doped region are connected to the circuit ground. The load may be either a resistor or a second NMOS transistor.

Moreover, the invention achieves the above-identified objects by providing an electrostatic discharge protection circuit coupled to a power rail. The circuit includes a semiconductor substrate and an N-well region formed on the substrate. At least one contact region is formed in the N-well region. An isolating structure is formed on the substrate, and a conducting layer is formed on the isolating structure and is coupled tothe contact region. A dielectric layer is formed overlying the conducting layer, and a metal pad is formed on the dielectric layer, such that the metal pad, the dielectric layer, and the conducting layer form a capacitor for coupling ESD stress to the N-well region when an ESD voltage appears at the pad.

A first P-type heavily-doped region is formed in the N-well region and is coupled to the pad. A second P-type heavily-doped region is formed in the N-well, spaced apart and electrically isolated from the first P-type heavily-doped region, for coupling to the power rail. A gate structure is formed on the N-well region between the first P-type heavily-doped region and the second P-type heavily-doped region, for connection to the power rail, such that the first P-type heavily-doped region, the second P-type heavily-doped region, the gate structure and the N-well region form a PMOS transistor which bypasses ESD stress when an ESD voltage is coupled to the one N-well region through the capacitor.

The PMOS transistor is coupled to the power end by a load connected between the contact region and the power rail, when the gate structure is connected to the power rail. The load may be either a resistor or mother PMOS transistor.

BRIEF DESCRIPTION OF THE DRAWINGS

Other objects, features and advantages of the invention will become apparent by way of the following detailed description of the preferred but non-limiting embodiments. The description is made with reference to the accompanying drawings, wherein.

DETAILED DESCRIPTION OF THE PREFERRED EMBODIMENTS

Figure 1:
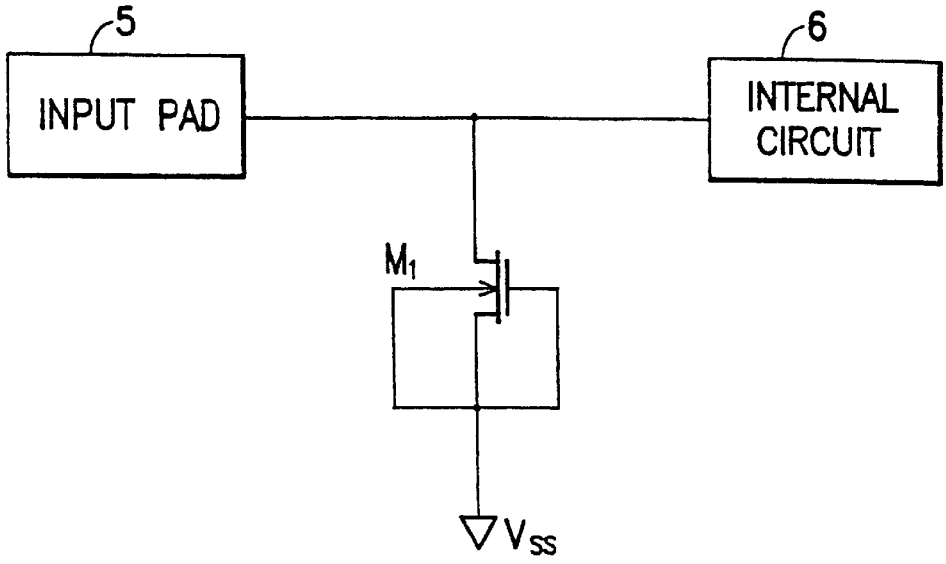
FIG. 1 (PRIOR ART)
FIG. 1 is a schematic diagram of a conventional ESD protection circuit composed of a NMOS transistor at an input pad.
Figure 2:
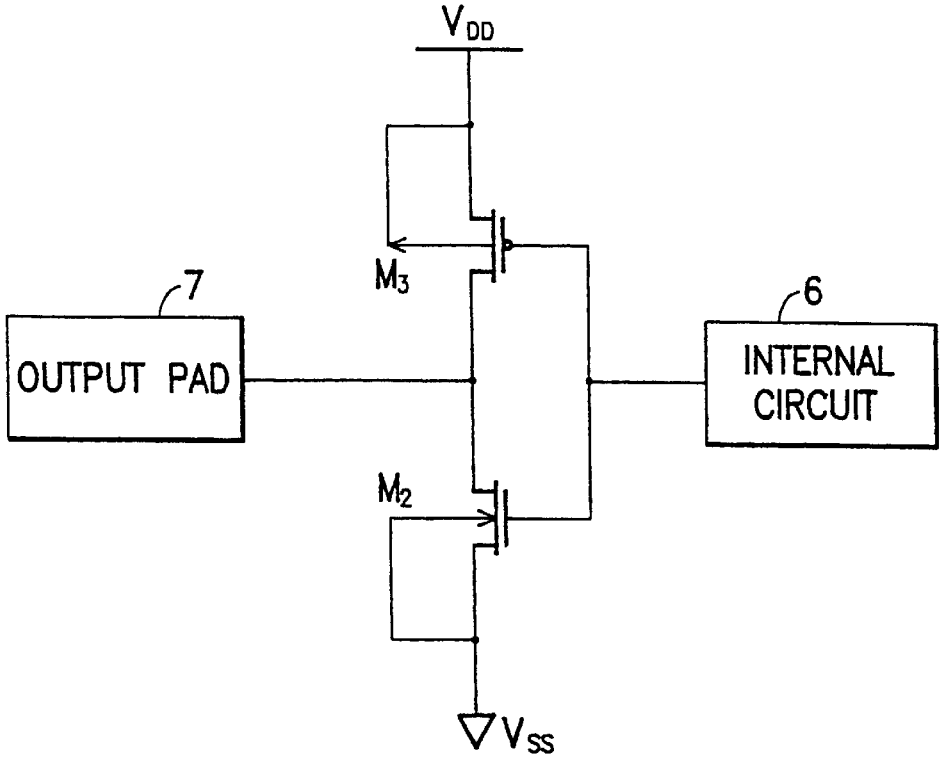
FIG. 2 (PRIOR ART)
FIG. 2 is a schematic diagram of a conventional ESD protection circuit composed of an output buffer at an output pad.
Figure 3:
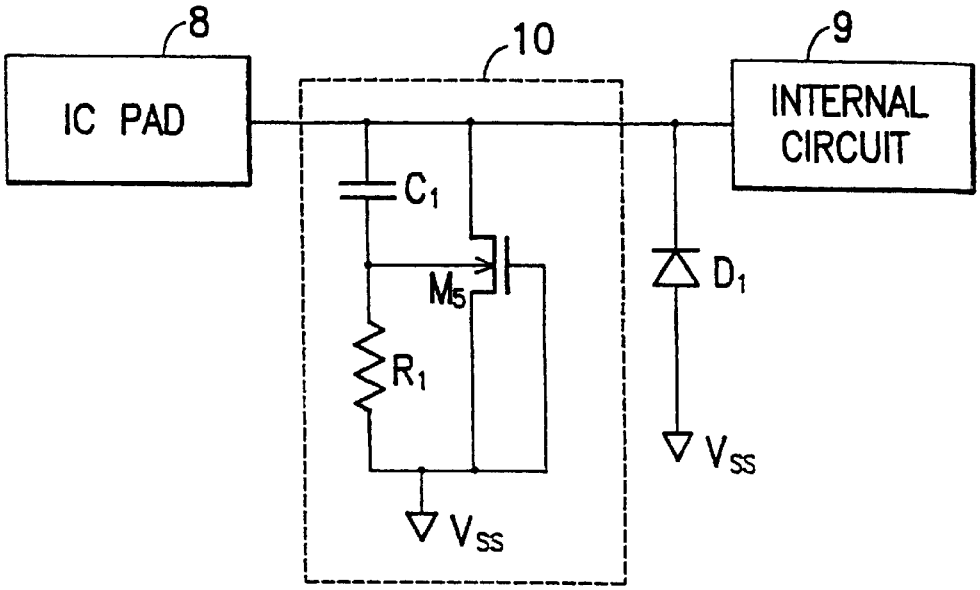
FIG. 3 is a schematic circuit diagram of one preferred embodiment of an ESD protection circuit in accordance with the invention.

Referring to FIG. 3, an ESD protection circuit 10, in accordance with the invention, is depicted positioned at an IC pad 8. The IC pad 8 is connected to an internal circuit 9, which is the circuit to be protected from ESD damage. The ESD protection circuit 10 includes an NMOS transistor $M_5$, a capacitor $C_1$, and a resistor $R_1$. The NMOS transistor $M_5$ is configured with a drain connected to the IC pad 8 and with a source connected to circuit ground $V_{SS}$. The gate of the NMOS transistor Ms is also tied to the circuit ground $V_{SS}$. The bulk of the NMOS transient $M_5$ is coupled by the resistor $R_1$ m circuit ground $V_{SS}$. The capacitor $C_1$ is connected between the IC pad 8 and the bulk of the transistor $M_5$. In addition, a diode $D_1$ is connected at its anode to circuit ground $V_{SS}$ and at its cathode to the IC pad 8.

Figure 4:
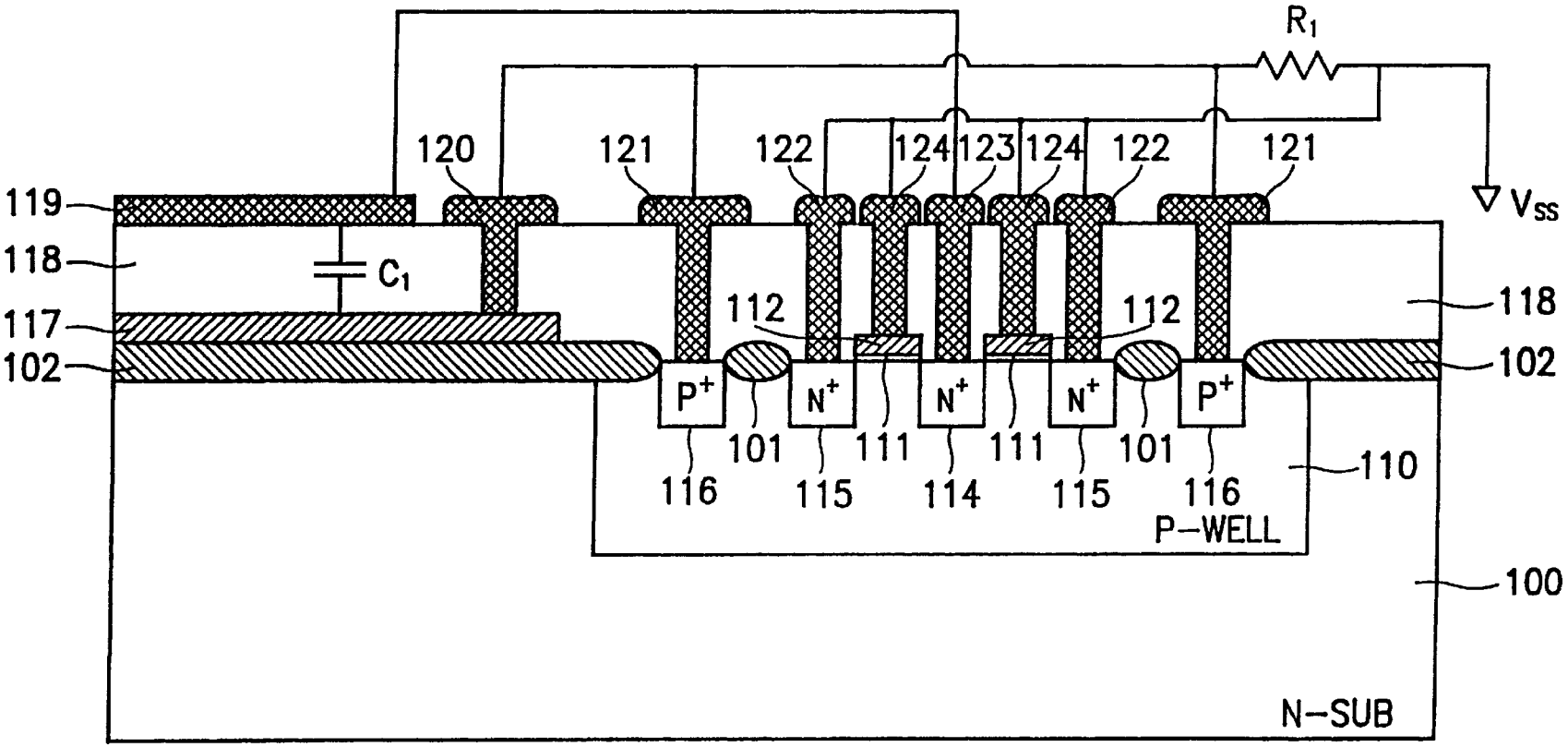
FIG. 4 is a cross-sectional view of the ESD protection circuit according to FIG. 3, fabricated on a semiconductor substrate.

Referring to FIG. 4, the ESD protection circuit 10 depicted in FIG. 3, as fabricated on an N-type semiconductor soberer, is illustrated in a cross-sectional view. As shown in the drawing, a P-well region 116 is formed in an N-type substrate 100. Field oxide portions 101 and 102 are thermally grown, preferably by a local oxidation of silicon ("LOCOS") process, overlying a predetermined area of five substrate, as isolating structures. A first N-type heavily-doped region 114 is formed in the P-well region 110 as the drain terminal of the NMOS transistor $M_5$. At least one second N-type heavily-doped region 115 (two second heavily-doped regions are exemplified in FIG. 4) is formed in the P-well region 110 as the source terminal of the NMOS transistor $M_5$ and is spaced apart from the first N-type heavily-doped region 114 by a corresponding gate structure. Each gate structure is formed on P-well region 110 between the fire N-type heavily doped region 114 and the second N-type heavily-doped region 115, including, from bottom to top, a gate dielectric layer 111 and a gate electrode 112 as the gate terminal of the NMOS transistor $M_5$. At least one contact region 116 (two contact regions are exemplified in FIG. 4) is formed in the P-well region 110 by implanting P-type impurities therein. Each contact region 116 is spaced apart from the adjacent second heavily-doped region 115 by a field oxide portion 161 to form the bulk terminal of the NMOS transistor $M_5$.

A polysilicon layer 117 doped with impurities is formed on one of the field oxide portions 102, preferably at one side of the substrate 100. A dielectric layer 118 is deposited to cover the overall surface and then is etched to shape several contact windows in order to expose the polysilicon layer 117, contact regions 116, first N-type heavily-doped region 114, second N-type heavily-doped regions 115, and the gate electrodes 112. A metal pad 119, which can be the IC pad 8 of FIG. 3, is formed on the dielectric layer 118 above the polysilicon layer 117. Accordingly, the pad 119, the dielectric layer 118, and the polysilicon layer 117 form a capacitor $C_1$. The capacitor $C_1$ therefore, is formed below the pad 119, without consuming area layout area. A plurality of metal contacts 120, 121, 122, 123, 124 are formed in the dielectric layer 118, filling in the corresponding contact windows, and are connected to the polysilicon layer 117, the contact regions 116, the second heavily-doped regions 115, first N-type heavily-doped region 114, and gate electrodes 112, respectively, via the associated contact windows.

According to the ESD protection circuit depicted is FIG. 3, the pad 119 is electrically coupled to the first N-type heavily-doped region 114 via the metal contact 123. The polysilicon layer 117 is electrically coupled by the metal contacts 120 and 121 to the contact regions 116, and is then coupled to circuit ground $V_{SS}$by the resistor $R_1$. Although designated by a component symbol, the resistor $R_1$ may be a thin-film resistor, a well resists, or any other electrical resistance component. Moreover, the second N-type heavily-doped region, 115 are electrically coupled by the metal contact 122 to circuit ground $V_{SS}$. Also, the gate electrodes 112 are electrically coupled by the contact metals 124 to circuit ground $V_{SS}$.

As shown in FIG. 4, when occurring at the pad 119, the voltage of a positive-to-ground ESD pulse is coupled to the well region 110 by the capacitor $C_1$, through the polysilicon layer 117 and the contact regions 116, to forward bias the junction between the P-well region 110 and the second N-type heavily-doped region 115. Consequently the NMOS transistor $M_5$ is operated directly in snapback mode without causing breakdown. Therefore, the ESD current is bypassed by flowing from the first N-type heavily-doped region 114 to the second N-type heavily-doped regions 115 and is then discharged to circuit ground $V_{SS}$. The ESD discharge current disperses through two opposing sides of the first N-type heavily-doped region 114 shown in FIG. 4 , in effect minimizing local heating of the ESD protection circuit. Moreover, the triggering voltage of the ESD protection circuit is lowered to the level of the snapback voltage instead of the level of the breakdown voltage. This turn-on voltage clamps the pad 119 to a low voltage level so that the internal circuit 9, as well as the output buffer, as protected from ESD damage.

Because the well region 110 is coupled by the resistor $R_1$ to circuit ground $V_{SS}$, the resistor $R_1$ and the capacitor $C_1$ provide a time delay to sustain the forward bias between the P-well region 110 and the second N-type heavily-doped regions 115 during the ESD event. As exemplified by the HBM model, the rise time of an ESD pulse is about 10 ns. Therefore, the RC time constant can be adjusted to within the range of about 10 as to sustain the forward bias during the ESD event. Accordingly, the capacitance of the capacitor $C_1$ may be selected from within the range of about 0.5–2 pF, and the resistance of the register R may be selected from within the range of about 5 KΩ to about 20 KΩ. However, while the power rail $V_{DD}$ is powered in normal operation, the NMOS transistor $M_5$ is turned off and the well region 110 is grounded via the resistor R and therefore will not float to induce a leakage current.

The diode $D_1$ as depicted in FIG. 3, may be formed from another $N^+$/p-well junction. When a negative-to-ground ESD pulse appears at the IC pad 8, the diode $D_1$ is forward biased to bypass the ESD stress, thereby protecting the internal circuit 9 from ESD damage. In addition, because the reverse breakdown voltage of the diode $D_1$ is about 12V, and the triggering voltage of NMOS transistor $M_5$ is lowered to about 7V the NMOS transistor Ms will be turned on prior to breakdown of the diode $D_1$ during positive-to-ground ESD stress at the IC pad 8.

Figure 5:
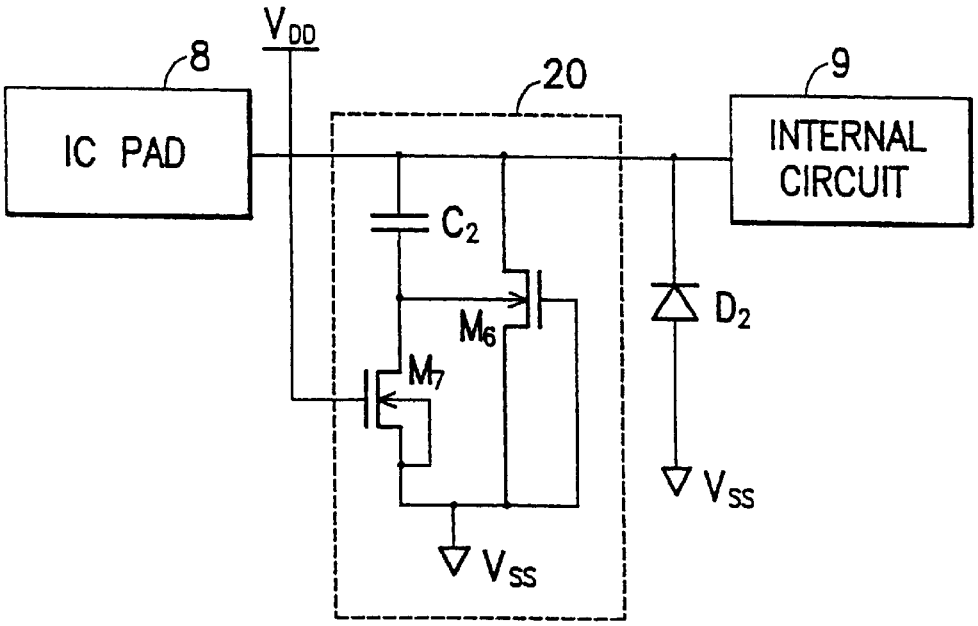
FIG. 5 is a schematic circuit diagram of mother preferred embodiment of an ESD protection circuit in accordance with the invention.

Referring to FIG. 5, another ESD protection circuit 20, in accordance with the invention, is depicted positioned at the IC pad 8. The IC pad 8 is connected to an internal circuit 9, which is the circuit to be protected from ESD carnage. The ESD protection circuit 20 includes a first NMOS transistor $M_6$, a capacitor $C_2$ and a second NMOS transistor $M_7$. The first NMOS transistor $M_6$ is configured with its drain connected to the IC pad 8 and with its source connected to circuit ground $V_{SS}$. The gate of the first NMOS transistor $M_6$ is also tied to circuit ground $V_{SS}$. The bulk of the first NMOS transistor $M_6$ is coupled to the drain of the second NMOS transistor $M_7$. The second NMOS transistor $M_7$ is configured with the gate controlled by a $V_{DD}$ power rail. Moreover, the bulk and worse of the second NMOS transistor $M_1$ are tied together and to the $V_{SS}$power rail. The capacitor $C_2$ is connected between the IC pad 8 and the bulk of the first NMOS transistor $M_6$. In addition, a diode $D_2$ is connected at its anode to circuit ground $V_{SS}$ and at its cathode to the IC pad 8.

Figure 6:
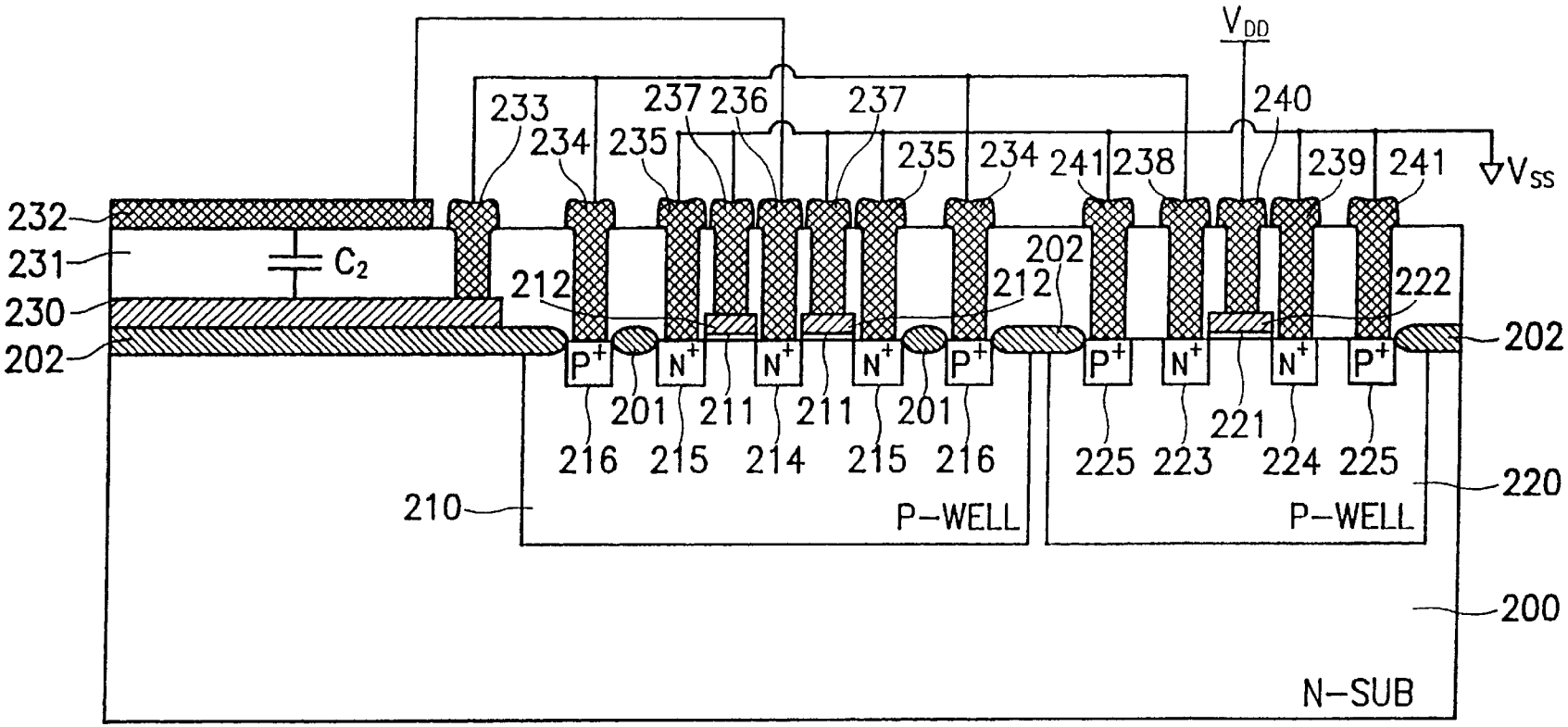
FIG. 6 is a cross-sectional view of the ESD protection circuit according to FIG. 5, fabricated on a semiconductor substrate.

Referring to FIG. 6, the ESD protection circuit 20 depicted in FIG. 5 is illustrated in a cross-sectional view, as fabricated on an N-type semiconductor substrate. As shown in the drawing, a first P-well region 210 and a second P-well region 220 are spaced apart and formed in an N-type substrate 200. The first NMOS transistor $M_6$ and the second NMOS transistor $M_7$ are fabricated onto first P-well region 210 and second P-well region 220, respectively. Field oxide portions 201 and 202 are thermally grown, preferably by a LOCOS process, overlying a predetermined area of the substrate 200, as isolating structures.

A first N-type heavily-doped region 214 is formed in the first P-well region 210 as the drain terminal of the first NMOS transacts $M_6$. At least one second N-type heavily-doped region 215 (two second heavily-doped regions are exemplified in FIG. 6) is formed in the first P-well region 210 as the source terminals of the first NMOS transistor $M_6$. The two second N-type heavily-doped regions 215 shown are symmetrical about and spaced apart from the first heavily-doped region 214 by a gate structure. Each gate structure is formed on the first P-well region 210 between the first N-type heavily-doped region 214 and a corresponding second N-type heavily-doped region 215, including, from bottom to top, a gate dielectric layer 211 and a gate electrode 212, as the gate terminal of the fast NMOS transistor $M_6$. At least one contact region 216 (two contact regions are exemplified in FIG. 6) is formed in the first P-well region 210 by implanting P-type impurities therein. Each contact region 216 is spaced apart from the adjacent second heavily-doped region 215 by one of the field oxide portions 201, to form the bulk terminal of the first NMOS transistor $M_6$.

The second NMOS transistor $M_7$ is fabricated on the second P-well region 220. Accordingly, the drain terminal 223 and source terminal 224 are formed in second P-well region 220 by implanting N-type impurities therein. A gate dielectric layer 221 is formed to cover the portion of the second P-well region 220 between the drain terminal 223 and the source terminal 224, and a gate 222 is formed on the gate dielectric layer 221. Furthermore, there are contact regions 225 formed in the second P-well region 220 as bulk terminal of the second NMOS transistor $M_7$.

A polysilicon layer 230 doped with impurities is formed on the field oxide portion 202. A dielectric layer 231 is deposited to cover the overall surface and then is etched to shape several contact windows in order to expose the polysilicon layer 230, contact regions 216, second N-type heavily-doped regions 215, first N-type heavily-doped region 214, and gate electrodes 212 of the first NMOS transistor $M_6$. Also, the bulk 225, drain 223, source 224, and gate 222 of the second NMOS transistor $M_7$ are exposed through corresponding contact windows. A metal pad 232, which can be the IC pad 8 of FIG. 5, is formed on the dielectric layer 231 above the polysilicon layer 230. Accordingly, the IC pad 232, the dielectric layer 231, and the polysilicon layer 230 form the capacitor $C_2$. The capacitor $C_2$, therefore, is formed below the pad 232, without consuming extra layout area. In addition, a plurality of metal contacts 233, 234, 235, 236, 237, 238, 239, 240, 241 are formed in the dielectric layer 231 and are connected to the polysilicon layer 230, contact regions 216, second heavily-doped regions 215, first heavily-doped region 214, gate electrodes 212, drain terminal 223, source terminal 224, gate 222, and bulk terminals 225, respectively, through the associated contact windows.

According to the ESD protection circuit depicted in FIG. 5, the pad 232 is electrically coupled to the first N-type heavily-doped region 214 via the metal contact 236. The polysilicon layer 230 is electrically coupled by the metal contacts 233 and 234 to the contact regions 216, and is also coupled to the drain terminal 223 of the second NMOS transistor $M_7$ via the metal contact 238. The second N-type heavily-doped regions 215 are electrically coupled by the metal contacts 235 to circuit ground $V_{SS}$. The gate electrodes 212 are coupled to circuit ground $V_{SS}$ via metal contacts 237. Moreover, the source terminal 224 and the bulk terminals 225 are coupled by the metal contacts 239 and 241, respectively, to the circuit ground $V_{SS}$. Further, the gate 222 of the second NMOS transistor $M_7$ is coupled by the metal contact 240 to the $V_{DD}$ power rail.

As shown in FIG. 6, when a positive-to-ground ESD pulse occurs a the pad 232, the voltage of the pulse is coupled to the first well region 210 by the capacitor $C_3$ to forward bias the junction between the first P-well region 210 and the second N-type heavily-doped region 215. Consequently, the first NMOS transistor $M_6$ is operated directly in snapback mode without causing breakdown. Therefore, the ESD current is bypassed by flowing from the fire N-type heavily-doped region 214 to the second N-type heavily-doped regions 215 and is then discharged to circuit ground $V_{SS}$. The ESD discharge current disperses through the two opposing sides of the first N-type heavily-doped region 214 shown in FIG. 6, in effect minimizing local heating of the ESD protection circuit Moreover, the triggering voltage of the ESD protection circuit is lowered to the level of the snapback voltage instead of the level of the breakdown voltage. This turn-on voltage clamps the pad 232 to a low voltage level so that the internal circuit 9, especially the gate oxide, are protected from ESD damage.

As shown in FIG. 6, the first well region 210 is coupled to the second NMOS transistor $M_7$ and to circuit ground $V_{SS}$. Thus, when the potential of the $V_{DD}$ power rail is held at a grounded state, the first P-well region 210 is not grounded during an ESD event. Consequently, the turned-off NMOS transistor $M_7$ can sustain the forward bias between the P-well region 210 and the second N-type heavily-doped regions 215 during the ESD event. However, while the power rail $V_{DD}$ is powered in normal operation (e.g., 5V), the first NMOS transistor $M_6$ turned off, and the first well region 210 is grounded via the turned-on second NMOS transistor $M_7$ and therefore will not float.

The diode $D_2$ depicted in FIG. 5 may be fabricated from another $N^+$/P-well junction. When a negative-to-ground ESD pulse appears a the IC pad 8, the diode $D_2$ is forward biased to bypass the ESD stress, thereby protecting the internal circuit 9 from ESD damage.

Figure 7:
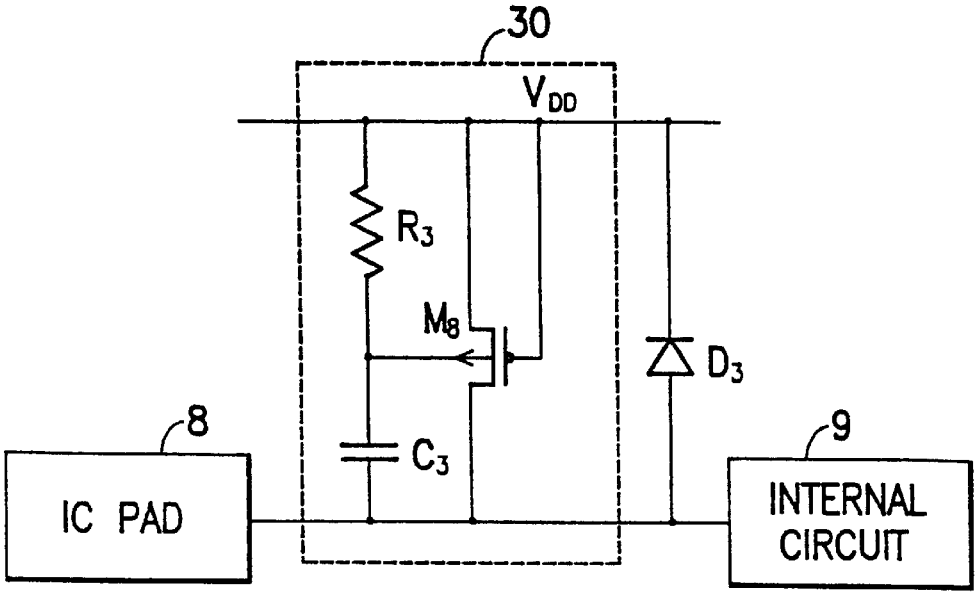
FIG. 7 is a schematic circuit diagram of another preferred embodiment of an ESD protection circuit in accordance will the invention.

Referring to FIG. 7, mother ESD protection circuit 30, in accordance with the invention, is depicted positioned at an IC pad 8. The IC pad 8 is connected to an internal circuit 9, which is the circuit to be protected from ESD damage. The ESD protection circuit 30 includes a PMOS transistor $M_8$, a capacitor $C_3$, and a resistor $R_3$. The PMOS transistor $M_8$ is configured with a drain connected the IC pad 8 and with a source connected to a power rail $V_{DD}$. The gate of the PMOS transistor $M_8$ is also tied to the power rail $V_{DD}$. The bulk of the PMOS transistor $M_8$ is coupled by the resistor $R_3$ to the power rail $V_{DD}$. The capacitor $C_3$ is connected between the IC pad 8 and the bulk of the transistor $M_8$. In addition, a diode $D_3$ is connected at its cathode to the power rail $V_{DD}$ and a its anode to the IC pad 8.

Figure 8:
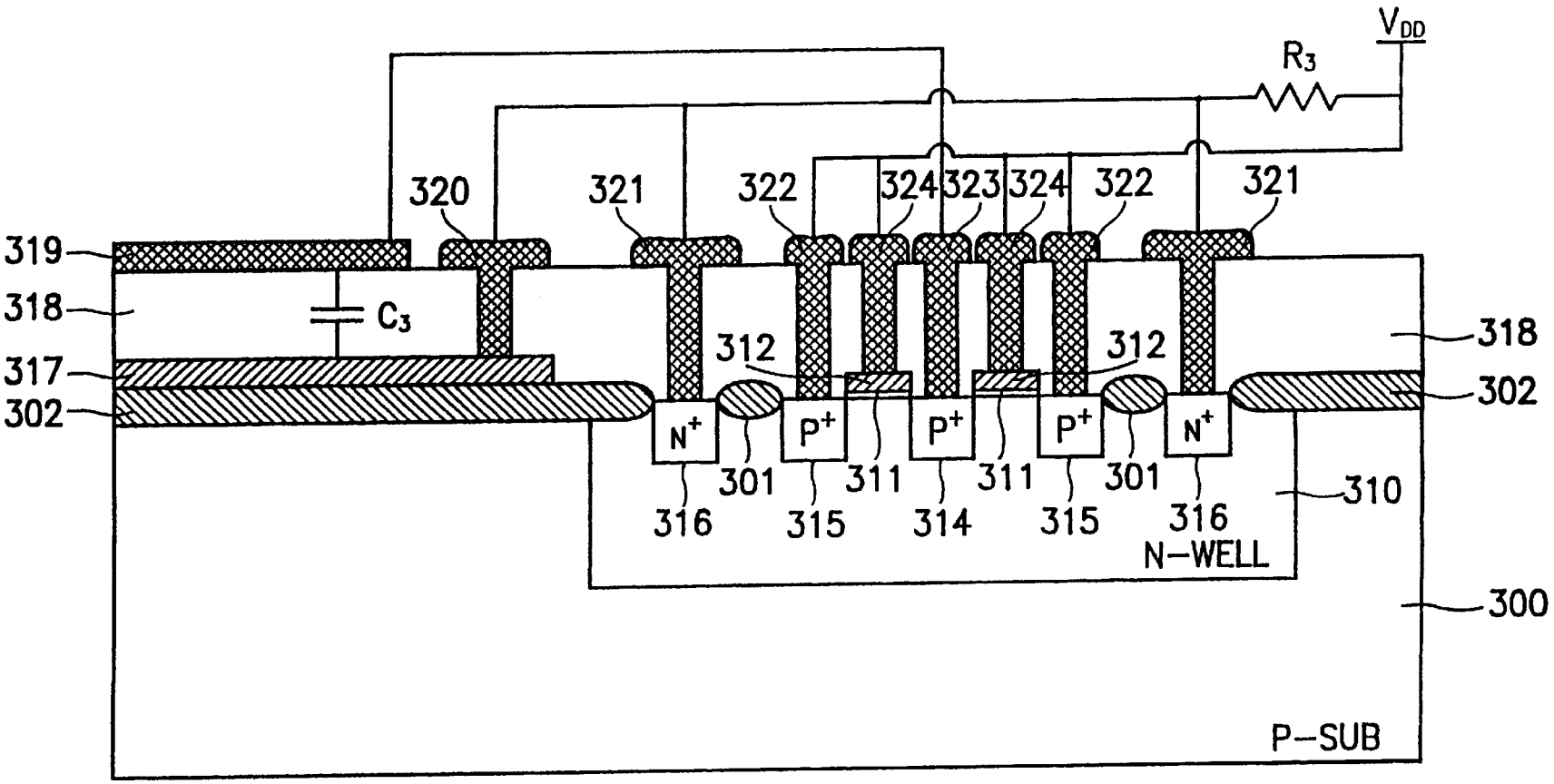
FIG. 8 is a cross-sectional view of the ESD protection circuit according to FIG. 7, fabricated on a semiconductor substrate.

Referring to FIG. 8, the ESD protection circuit 30 depleted in FIG. 7, a fabricated onto a semiconductor substrate, is illustrated in a cross-sectional view. As shown in the drawing, an N-well region 310 is formed in an P-type substrate 300. Field oxide portions 301 and 302 are thermally grown, preferably by a LOCOS process, overlying a predetermined area of the substrate, as isolating structures. A fist P-type heavily-doped region 314 is formed in the N-well region 310 to the drain terminal of the PMOS transient $M_8$. At least one second P-type heavily-doped region 315 (two second heavily-doped regions are exemplified in FIG. 8) is formed in the N-well regions 310 as the source terminal of the PMOS transistor $M_8$ and is spaced apart from the first P-type heavily-doped region 314 by a corresponding gate structure. Each gate structure is formed on the N-well region 310 between the first P-type heavily-doped region 314 and the second P-type heavily-doped region 315, including, from bottom to top, a gate dielectric layer 311 and a gate electrode 312 as the gate terminal of the PMOS transistor $M_5$. At least one contact region 316 (two contact regions are exemplified in FIG. 8) is formed in the N-well region 310 by implanting N-type impurities therein. Each contactregion 316 is spaced apart form the adjacent second heavily-doped region 315 by a field oxide portion 301 to form the bulk terminal of the PMOS transistor $M_8$.

A polysilicon layer 317 doped with impurities is formed on one of the field oxide portions 302, preferably at one side of the substrate 300. A dielectric layer 318 is deposited to cover the overall surface and then is etched to shape several contact windows in order to expose the polysilicon layer 317, contact regions 316, first P-type heavily-doped region 314, second P-type heavily-doped regions 315, and gate electrode 312. A metal pad 319, which can be the IC pad 8 of FIG. 7, is formed on the dielectric layer 318 above the polysilicon layer 317. Accordingly, the pad 319, the dielectric layer 318, and the polysilicon layer 317 form a capacitor $C_3$. The capacitor $C_3$, therefore, is formed below the pad 319, without consuming extra layout area. A plurality of metal contacts 320, 321, 322, 323, 324 are formed in the dielectric layer 318, filling in corresponding contact windows, and are connected to the polysilicon layer 317. contact regions 316, second P-type heavily-doped regions 315, first P-type heavily-doped region 314, and gate electrodes 312 via the associated contact windows, respectively.

According to the ESD protection circuit depicted in FIG. 8, the pad 319 is electrically coupled to the first P-type heavily-doped region 314 via the metal contact 323. The polysilicon layer 317 is electrically coupled by the metal concocts 320 and 321 to the contact regions 316, and is coupled to the power rail Von by the resistor $R_3$. Although designated by a component symbol, the resistor $R_3$ may be a thin-film resistor, a well resistor, or any other electrical resistance component. Moreover, the second P-type heavily doped regions 315 are electrically coupled by the metal contact 322 to the power rail $V_{DD}$. Also, the gate electrodes 312 ale electrically coupled by the contact metals 324 to the power rail $V_{DD}$.

As shown in FIG. 8, when occurring to the pad 319, the voltage of a negative-to-$V_{DD}$ ESD pulse is coupled to the well region 310 by the capacitor $C_3$, through the polysilicon layer 317 and the contact regions 316, to formed bias the junction between the N-well region 310 and the second P-type heavily-doped region 315. Consequently, the PMOS transistor $M_8$ is instantly operated directly in PNP bipolar mode, and turned on. Therefore, the ESD current is bypassed by flowing from the second P-type heavily-doped regions 315 to the first P-type heavily-doped mom 314 and is then discharged from the pad 319 to the power rail $V_{DD}$. The ESD discharge current disperses through the two opposing sides of the first P-type heavily-doped region 314 show in FIG. 8, in effect minimizing local heating of the ESD protection circuit as well as efficiently bypassing the ESD stress. This turn-on voltage clamps the pad 319 to a low voltage level so that the internal circuit 9, as well as the output buffer, are protected from ESD damage.

Because the well region 310 is coupled by the resistor $R_3$ to the power rail $V_{DD}$, the resister $R_3$ and the capacitor $C_3$ provide a time delay to sustain the forward bias between the N-well region 310 and the second P-type heavily-doped regions 315 during the ESD event. As exemplified by the HBM model, the rise time of the ESD pulse is about 10 ns. Therefore, the RC time constant can be adjusted to the range of about 10 ns to sustain the forward bias during the ESD event. Accordingly, the capacitance of the capacitor $C_3$ may be selected from the range of about 0.5–2 pF, and the resistance of the registers R may be selected from the range of about 5 KΩ to about 20 KΩ. However, while the power rail $V_{DD}$ is powered in normal operation (e.g., $V_{DD}$=5V), the PMOS transistor $M_8$ is turned off and the well region 310 is pumped up to the $V_{DD}$ potential via the resistor $R_3$, and therefore will not floor, which would induce an leakage current.

The diode $D_3$, as depicted in FIG. 3, may be built by another $P^+$/N-well junction. When a positive-to-$V_{DD}$ ESD pulse appears at the IC pad 8, the diode $D_3$ is forward biased to bypass the ESD stress, thereby protecting the internal circuit 9 from ESD damage.

Figure 9:
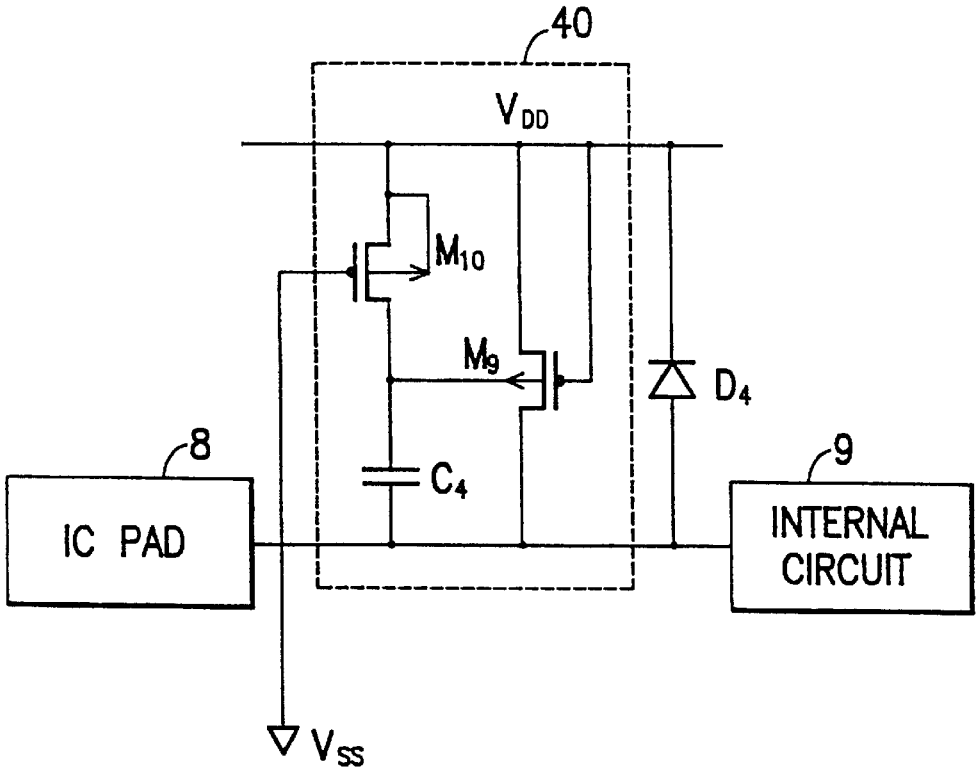
FIG. 9 is a schematic circuit diagram of yet another preferred embodiment of an ESD protection circuit in accordance with the invention.

Referring to FIG. 9, yet another ESD protection circuit 40, in accordance with the invention, is depicted positioned at the IC pad 8. The IC pad 8 is connected to an internal circuit 9, which is the circuit to be protected from ESD damage. The ESD protection circuit 40 includes a first PMOS transistor $M_9$, a capacitor $C_4$, and a second PMOS transistor $M_{10}$. The first PMOS transistor $M_9$ is configured with a drain connected the IC pad 8 and with a source connected to a power rail $V_{DD}$. The gate of the first PMOS transistor $M_9$ is also tied to the power rail $V_{DD}$. The bulk of the first PMOS transistor $M_9$ is coupled to the drain of the second PMOS transistor $M_{10}$. The second PMOS transistor $M_{10}$ is configured with the gate connected to circuit ground $V_{SS}$. Moreover, the bulk and source of the second PMOS transistor $M_{10}$ are tied together and to the $V_{DD}$ power rail. The capacitor $C_4$ is connected between the IC pad 8 and the bulk of the first PMOS transistor $M_9$. In addition, a diode $D_4$ is connected at its cathode to the power rail $V_{DD}$ and at its anode to the IC pad 8.

Figure 10:
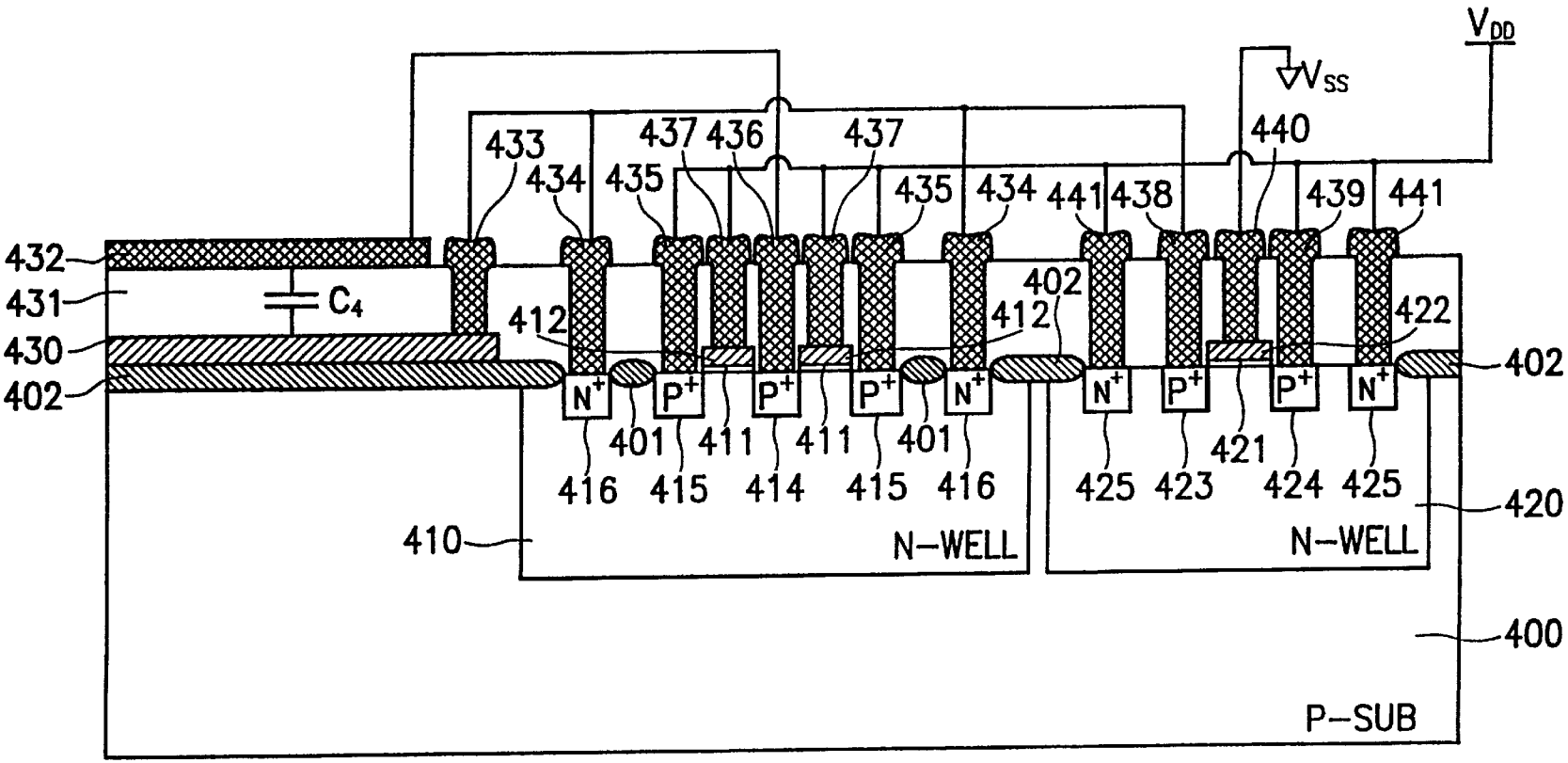
FIG. 10 is a cross-sectional view of the ESD protection circuit according to FIG. 9, fabricated on a semiconductor substrate.

Referring to FIG. 10, the ESD protection circuit 40 depicted in FIG. 9, as fabricated on a P-type semiconductor substrate, is illustrated in a cross-sectional view. As shown in the drawing, a first N-well region 410 and a second N-well region 420 are formed and spaced apart in a P-type substrate 400. The first PMOS transistor $M_9$, and the second PMOS transistor $M_{10}$ are fabricated onto first N-well region 416 and second N-well region 429, respectively. Field oxide portions 401 and 402 are thermally grown, preferably by a LOCOS process, overlying a predetermined area, of the substrate 400, as isolating structures.

A first P-type heavily-doped region 414 is formed in the first N-well region 410 as the drain terminal of the first PMOS transistor $M_9$. At least one second P-type heavily-doped region 415 (two second heavily doped regions are exemplified in FIG. 6) is formed in the first N-well region 410 as the source terminal of the first PMOS transistor $M_9$. The two second P-type heavily-doped regions 415 shown are symmetrical about and spaced apart from the firm heavily-doped region 414 by a gate structure. Each gate structure is formed on the first N-well region 410 between the first P-type heavily-doped region 414 and a corresponding second P-type heavily-doped region 415, including, from bottom to top, a gate dielectric layer 411 and a gate electrode 412, as the gate terminal of the first PMOS transistor $M_9$. At least one contact region 416 (two contact regions are exemplified in FIG. 6) is formed in the first N-well region 410 by implanting N-type impurities therein. Each contact region 416 is spaced apart from the adjacent second heavily-doped region 415 by one of the field oxide portions 401, to form the bulk terminal of the first PMOS transistor $M_{10}$.

The second PMOS transistor $M_{10}$, is fabricated on the second N-well region 420. Accordingly, the drain terminal 423 and source terminal 424 are formed in the second N-well region 420 by implanting N-type impurities therein. A gate dielectric layer 421 is formed to cover the potion of the second N-well region 420 between the drain terminal 423 and the source terminal 424 and a gate 422 is formed on the gate dielectric layer 421. Furthermore, there are contact regions 425 formed in the second N-well region 429 as the bulk terminals of the second PMOS transistor $M_{10}$.

A polysilicon layer 430 doped with impurities is formed on the field oxide portion 402. A dielectric layer 431 is deposited to cover the overall surface and then is etched to shape several contact windows in order to expose the polysilicon layer 430, contact regions 416, second P-type heavily-doped regions 415, first P-type heavily-doped region 414, and gate electrodes 412 of the first PMOS transistor $M_9$. Also, the bulk 425 drain 423, source 424, and gate 422 of the second PMOS transistor $M_{10}$ are exposed through corresponding contact windows. A metal pad 432, which can be the IC pad 8 of FIG. 9, is formed on the dielectric layer 431 above the polysilicon layer 430. Accordingly, the IC pad 432, the dielectric layer 431, and the polysilicon layer 430 form the capacitor $C_4$. The capacitor $C_4$, therefore, is formed below the pad 432, without consuming extra layout area. In addition, a plurality of metal contacts 433, 434, 435, 436, 437, 438, 439, 440, 441 are formed in the dielectric layer 431 and are connected to the polysilicon layer 430, contact regions 416, second heavily-doped regions 415, first heavily-doped region 414, gate electrodes 412, drain terminal 423, source terminal 424, gate 422, and bulk terminals 425, respectively, through the associated contact windows.

According to the ESD protection circuit depicted in FIG. 9, the pad 432 is electrically coupled to the first P-type heavily-doped region 414 via the metal contact 436. The polysilicon layer 430 is electrically coupled by the metal contacts 433 and 434 to the contact regions 416, and is also coupled to the drain terminal 423 of the second PMOS transistor $M_{10}$ via the metal contact 438. The second P-type heavily-doped regions 415 are electrically coupled by the metal contacts 435 to the power rail $V_{DD}$. Moreover, the source resonant 424 and the bulk terminal 425 are coupled by the metal contacts 439 and 441 to the $V_{DD}$ power rail, respectively. Further, the gate 422 of the second PMOS transistor $M_{10}$ is coupled by the metal contact 440 to the circuit ground $V_{SS}$.

As shown in FIG. 10, when a negative-to-$V_{DD}$ ESD pulse occurs at the pad 432, the voltage of ESD pulse is coupled to the first well region 410 by the capacitor $C_4$ to forward bias the junction between the first-N-well region 410 and the second P-type heavily-doped region 415. Consequently, the first PMOS transistor $M_9$ is directly operated in PNP bipolar mode and is turned on. Therefore, the ESD current is bypassed by flowing from the second P-type heavily-doped regions 415 to the first P-type heavily-doped region 414. The ESD discharge current disperses through own opposing sides of the first P-type heavily-doped region 414 shown in FIG. 10, in effect minimizing local heating of the ESD protection circuit as well as efficiently bypassing the ESD stress. This turn-on voltage clamps the pad 432 to a low voltage level so that the internal circuit 9, especially the gate oxide, are protected from ESD damage.

As shown in PIG. 10, the first well region 410 is coupled by the second PMOS transistor $M_{10}$ to the power rail $V_{DD}$ THUS, with the potential of $V_{SS}$being held at a grounded state, the second PMOS transistor $M_{10}$ can sustain the forward bias between the N-well region 410 and the second P-type heavily-doped regions 415 during an ESD event However, when the power rail $V_{DD}$ is powered during normal operation (e.g., 5V), the first PMOS transistor $M_9$ remains turned off and the first well region 220 is boosted to the $V_{DD}$ potential via the turned-on second PMOS transistor $M_{10}$.

The diode $D_4$ depicted in FIG. 9 may be fabricated from mother $P^+$/N-well junction. When a positive-to-ground EDS pulse appears at the IC pad 8, the diode $D_4$ is forward biased to bypass the ESD stress, thereby protecting the internal circuit 9 from ESD damage.

In conclusion, the NMOS-based ESD protection circuits, in accordance with the invention, have a decreased triggering voltage approximately equal to their snapback voltage (~5V). Moreover, applied to the multi-finger structure of the ESD protection circuit design layout, either PMOS-based or NMOS-based ESD protection circuits can be utilized for uniform ESD damage protection. Furthermore, the ESD current is conducted for away from the well/dielectric-layer junction, without causing damage of polysilicon filaments.

Alternative embodiments of the invention have now been described in detail. It is to be noted, however, that this description of these embodiments is illustrative of the principles underlying the inventive concept. It is therefore contemplated that various modifications of the disclosed embodiments will, without departing from the spirit and scope of the invention, be apparent to persons of ordinary skill in the art, and the scope of the invention is intended to be limited only by the appended claims.

What is claimed is:

1. An electrostatic discharge protection circuit for protecting an internal circuit, comprising:

an N-type semiconductor substrate;

a P-well region in the substrate;

a contact region in the P-well region;

an isolating structure on the substrate;

a conducting layer on the isolating structure, coupled to the contact region;

a dielectric lays overlying the conducting layer;

a metal pad on the dielectric layer, wherein the metal pad, the dielectric layer, and the conducting layer form a capacitor for coupling ESD voltage to the P-well region when an ESD stress is present at the pad;

a first N-type heavily-doped region in the P-well region, coupled to the pad;

a second N-type heavily-doped region for coupling to a circuit ground of the internal circuit, the second N-type heavily doped region being disposed in the P-well region, spaced apart from and electrically isolated from the first N-type heavily-doped region;

a gate structure, disposed on the P-well region between the first N-type heavily-doped region and the second N-type heavily-doped region, for connection to the circuit ground, wherein the first N-type heavily-doped region, the second N-type heavily-doped region, the gate structure, and the P-well region form an NMOS transistor which bypasses ESD stress when an ESD voltage is coupled to the P-well region through the capacitor; and a load connected between the contact region and the circuit ground when the gate structure and the second N-type heavily doped region are connected to the circuit ground, for coupling the P-well region of the NMOS transistor to the circuit ground.

2. The electrostatic discharge protection circuit as claimed in claim 1, wherein the load is a resistor.

3. The electrostatic discharge protection circuit as claimed in claim 1, wherein the load includes means for coupling to a power rail of the internal circuit.

4. The electrostatic discharge protection circuit as claimed in claim 3, wherein the NMOS transistor is a first NMOS transistor, and the load is a second NMOS transistor comprising a drain connected to the contact region, a source for connection to the circuit ground, and a gate for connection to the power rail.

5. The electrostatic discharge protection circuit as claimed in claim 4, wherein the P-well region is a first P-well region, and further comprising a second P-well region in the semiconductor substrate.

6. The electrostatic discharge protection circuits, claimed in claim 5, wherein the second NMOS transistor is disposed on the second P-well region.

7. The electrostatic discharge protection circuit as claimed in claim 1, further comprising a diode having an anode for connection to the circuit ground end a cathode connected to the metal pad.

8. The electrostatic discharge protection circuit as claimed in claim 4, wherein the second NMOS transistor further comprises a bulk terminal for coupling to the circuit ground.

9. An electrostatic discharge protection circuit for coupling to a power rail, comprising:

a P-type semiconductor substrate;

an N-well region in the substrate;

a contact region in the N-well region;

an isolating someone on the substrate;

a conducing layer on the isolating structure, coupled to the contact region;

a dielectric layer overlying the conducting layer;

a metal pad on the dielectric layer, wherein the metal pad the dielectric layer, and the conducting layer form a capacitor for coupling ESD voltage to the N-well region when an ESD stress is present at the pad;

a first P-type heavily-doped region is the N-well region, coupled to the pad;

a second P-type heavily-doped region in the N-web region, spaced apart from and electrically isolated from the first P-type heavily-doped region, for coupling to the power rail:

a gate structure, formed on the N-well region between the first P-type heavily-doped region and the second P-type heavily-doped region, for correction to the power rail, wherein the first P-type heavily-doped region, the second P-type heavily-doped region, the gate structure, and the N-well region form a PMOS transistor which bypasses ESD stress when an ESD voltage is coupled to the N-well region through the capacitor; and a load connected between the contact region and the power rail when the gate structure is connected to the power rail, for coupling the N-well region of the PMOS transistor to the power rail.

10. The electrostatic discharge protection circuit as claimed in claim 9, wherein the load is a resistor.

11. The electrostatic discharge protection circuit as claimed in claim 9, wherein the PMOS transistor is a first PMOS transistor and the load is a second PMOS transistor comprising a drain connected to the contact region, a source for connection to the power rail, and a gate for connection to a circuit ground.

12. The electrostatic discharge protection circuit as claimed in claim 11, wherein the N-well region is a first N-well region, and further comprising a second N-well region formed in the semiconductor substrate.

13. The electrostatic discharge protection circuit as claimed in claim 12, wherein the second PMOS transistor is disposed on the second N-well region.

14. The electrostatic discharge protection circuit as claimed in claim 9, further comprising a diode having a cathode for connection to the power rail and an anode connected to the metal pad.

15. The electrostatic discharge protection circuit as claimed is claim 11, wherein the second PMOS transistor further comprises a bulk terminal for coupling to the power rail.

*16. An electrostatic discharge protection circuit for an integrated circuit, comprising:*

*an NMOS transistor having a source terminal, a drain terminal, a gate terminal electrically coupled to a circuit ground, and a bulk terminal;*

*a capacitor coupled between the bulk terminal and a first node; and*

*a load coupled between the bulk terminal and a second node, wherein said second node is a power rail and said power rail is $V_{SS}$ bus.*

*17. An electrostatic discharge protection circuit for an integrated circuit, comprising:*

*an NMOS transistor having a source terminal a drain terminal a gate terminal electrically coupled to a circuit ground, and a bulk terminal;*

*a capacitor coupled between the bulk terminal and a fast node; and*

*a load coupled between the bulk terminal and a second node, wherein said second node is a power rail and said power rail is the circuit ground.*

*18. An electrostatic discharge protection circuit for an integrated circuit, comprising:*

*a first MOS transistor having a source terminal, a drain terminal, a gate terminal, and a bulk terminal;*

*a capacitor coupled between the bulk terminal and a first node; and*

*a load coupled between the bulk terminal and a second node wherein said load is a second MOS transistor.*

*19. An electrostatic discharge protection circuit for an integrated circuit, comprising:*

*a first MOS transistor having a source terminal, a drain terminal, a gate terminal, and a bulk terminal;*

*a capacitor coupled between the bulk terminal and a first node; and*

*a load coupled between the bulk terminal and a second node,*

*wherein said load is a second MOS transistor having a gate, and the gate of said second MOS transistor is coupled to a power rail.*

*20. An electrostatic discharge protection circuit for an integrated circuit, comprising:*

*an MOS transistor having a source terminal, a drain terminal, a gate terminal, and a bulk terminal;*

*a capacitor coupled between the bulk terminal and a first node; and*

*a load coupled between the bulk terminal and a second node, wherein said gate terminal is coupled to said second node.*

*21. A method of fabricating an integrated circuit with an ESD protection device for protection against ESD stress at a first node by, the method comprising*

*forming said ESD protection device of a bulk terminal of a first conductivity type, and first and second diffusion regions of a second conductivity type, wherein said first diffusion region is coupled to the first node and said second diffusion region is coupled to a power rail; and*

*coupling said bulk terminal to said first node;*

*wherein the potential of said bulk terminal changes and a forward bias forms between said bulk terminal and said second diffusion region when ESD stress develops at the first node, further comprising coupling said bulk terminal to said power rail;*

*wherein a potential of the bulk terminal is brought to substantially the same as a potential level of said power rail after a time delay when ESD stress develops at the first node,*

*wherein said coupling of the bulk terminal to the power rail is made through a load, and*

*wherein said load is a transistor.*

*22. The method of claim 21, wherein said power rail is a first power rail and said transistor load is an MOS transistor having a gate, the method further comprising coupling the gate to a second power rail.*

* * * * *